United States Patent
Nguyen

(10) Patent No.: US 10,186,431 B2
(45) Date of Patent: Jan. 22, 2019

(54) INTEGRATED CIRCUIT PACKAGE MOLD ASSEMBLY

(71) Applicant: Texas Instruments Incorporated, Dallas, TX (US)

(72) Inventor: Hiep Xuan Nguyen, Grand Prairie, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/899,203

(22) Filed: Feb. 19, 2018

(65) Prior Publication Data

US 2018/0190509 A1 Jul. 5, 2018

Related U.S. Application Data

(62) Division of application No. 14/880,976, filed on Oct. 12, 2015.

(51) Int. Cl.
| | |
|---|---|
| *H01L 21/56* | (2006.01) |
| *H01L 23/31* | (2006.01) |

(Continued)

(52) U.S. Cl.
CPC .......... *H01L 21/561* (2013.01); *H01L 21/565* (2013.01); *H01L 24/97* (2013.01); *H01L 21/6835* (2013.01); *H01L 23/3121* (2013.01); *H01L 23/49537* (2013.01); *H01L 24/48* (2013.01); *H01L 24/85* (2013.01); *H01L 2224/45099* (2013.01); *H01L 2224/48091* (2013.01); *H01L 2224/48227* (2013.01); *H01L 2224/48247* (2013.01); *H01L 2224/73265* (2013.01); *H01L 2224/85005* (2013.01); *H01L 2224/97* (2013.01); *H01L 2924/00014* (2013.01); *H01L 2924/14* (2013.01); *H01L 2924/15311* (2013.01);

(Continued)

(58) Field of Classification Search
CPC ........... H01L 21/67121; H01L 23/3114; H01L 23/49805; H01L 24/01; H01L 33/48; H01L 2023/4031; H01L 2221/68313; H01L 2223/54486; H01L 2224/01; H01L 2224/04105; H01L 2224/12105; H01L 2224/28105
USPC ....... 257/774, 522, 419, 773, 758, 737, 499, 257/762, 764, 506; 438/303, 591, 618, 438/421, 584, 637, 783, 763, 123–124, 438/108

See application file for complete search history.

(56) References Cited

U.S. PATENT DOCUMENTS

| | | |
|---|---|---|
| 2006/0263929 A1 | 11/2006 | Matsunami |
| 2009/0093088 A1 | 4/2009 | Ano |

(Continued)

*Primary Examiner* — Moin Rahman
(74) *Attorney, Agent, or Firm* — Dawn Jos; Charles A. Brill; Frank D. Cimino

(57) ABSTRACT

An integrated circuit ("IC") package mold includes an upper mold platen that defines an upper mold cavity for receiving an upper substrate having a die attach side with a plurality of dies mounted thereon and a non-attach side with no dies mounted thereon. The die attach side of the upper substrate faces upwardly. A lower mold platen defines a lower mold cavity for receiving a lower substrate having a die attach side with a plurality dies mounted thereon and a non-attach side with no dies mounted thereon. The die attach side of the lower substrate faces downwardly.

14 Claims, 5 Drawing Sheets

(51) Int. Cl.
*H01L 21/683* (2006.01)
*H01L 23/00* (2006.01)
*H01L 23/495* (2006.01)

(52) U.S. Cl.
CPC ............... *H01L 2924/19041* (2013.01); *H01L 2924/19042* (2013.01); *H01L 2924/19043* (2013.01); *H01L 2924/19105* (2013.01); *H01L 2924/3511* (2013.01)

(56) References Cited

U.S. PATENT DOCUMENTS

| | | | |
|---|---|---|---|
| 2011/0036174 A1* | 2/2011 | Hooper | B81B 7/0061 73/721 |
| 2013/0075917 A1 | 3/2013 | Law et al. | |
| 2013/0140737 A1* | 6/2013 | Keong | B29C 45/14065 264/272.15 |

* cited by examiner

INTEGRATED CIRCUIT PACKAGE MOLD ASSEMBLY

This application is a divisional of U.S. patent application Ser. No. 14/880,976, filed Oct. 12, 2015, the entirely of which is hereby incorporated by reference.

BACKGROUND

Integrated circuits, also referred to as "IC's" or "semiconductor chips" or simply "chips," are electronic circuits made by diffusion of trace elements into the surface of thin substrates of semiconductor material. Integrated circuits were first produced in the mid 20$^{th}$ Century. Because of their small size and relatively low production cost, integrated circuits are now used in most modern electronics. Semiconductor chips are typically mass produced in the form of a single wafer that contains a large number of identical integrated circuits. The wafer is cut ("singulated") into a number of individual semiconductor chips referred to as "dies" or "dice."

Dies and sometimes other components such as passive devices are "packaged" to prevent damage to the dies and to facilitate attachment of the dies to circuit boards. Various packaging materials and processes have been used to package integrated circuit dies. One conventional packaging method involves mounting individual dies in a predetermined pattern on a substrate strip. The dies mounted on the substrate strip are then encapsulated in a plastic material, such as by a transfer molding process. Next, the encapsulated dies are singulated into individual integrated circuit packages by cutting the encapsulated die/substrate strip in accordance with the predetermined die mounting pattern. Typical cutting tools include saws and punches. Each integrated circuit package generally includes at least one die and the underlying portion of the substrate strip on which it was mounted. The underlying substrate strip is sometimes a leadframe to which the die is electrically connected.

SUMMARY

An integrated circuit ("IC") package mold assembly includes an upper mold platen defines an upper mold cavity for receiving an upper substrate having a die attach side with a plurality of dies mounted thereon and a non-attach side with no dies mounted thereon. The die attach side faces upwardly. A lower mold platen defines a lower mold cavity for receiving a lower substrate having a die attach side with a plurality dies mounted thereon and a non-attach side with no dies mounted thereon. The die attach side of the lower substrate faces downwardly.

DETAILED DESCRIPTION

Figure 1:
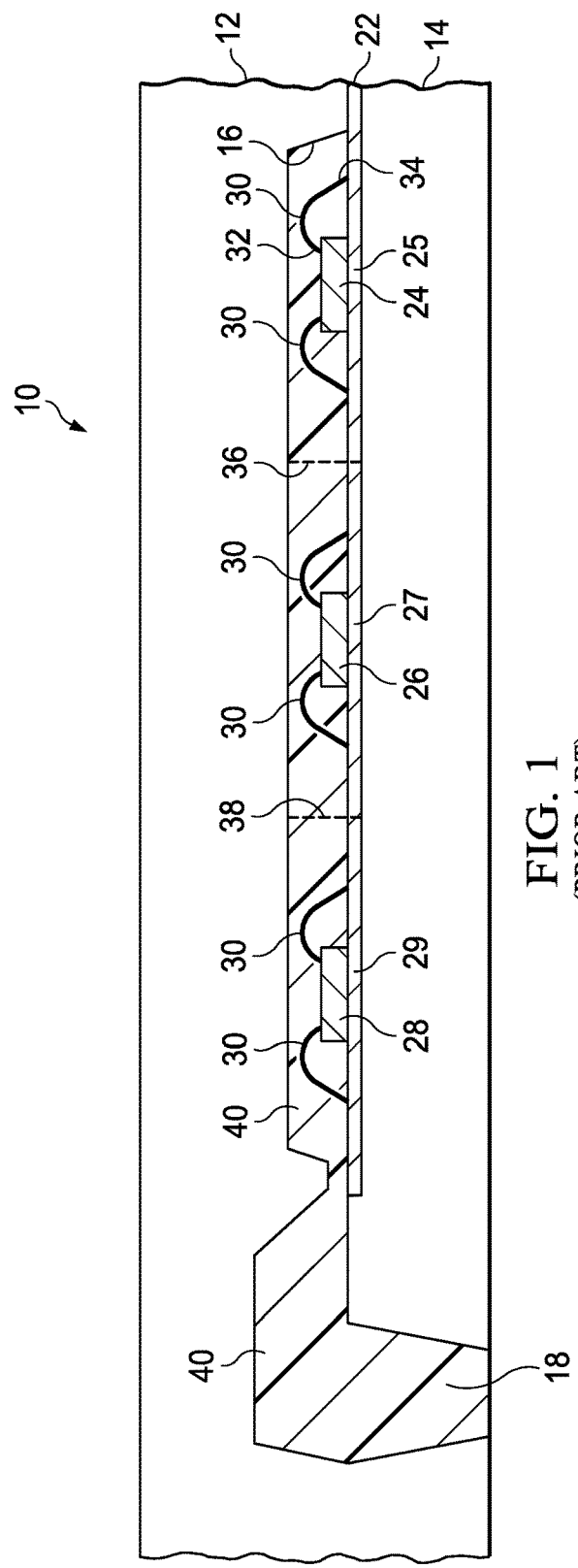
FIG. 1 is a cross-sectional elevation view of a prior art mold assembly.

FIG. 1 is a cross-sectional elevation view of a prior art mold assembly 10. The mold assembly 10 includes a mold 11, such as an injection mold, that has an upper mold platen 12 and a lower mold platen 14. The upper mold platen 12 has a mold cavity 16 therein in fluid communication with a mold runner 18. The mold assembly 10 also includes a leadframe sheet 22 that is positioned within the mold cavity 16. The mold assembly 10 further includes a plurality of integrated circuit (IC) dies 24, 26, 28, etc., which are attached to different portions 25, 27, 29, etc., of the leadframe sheet 22. Each of these portions 25, 27, 29 is associated with a separate IC package that will ultimately be formed by singulating ("dicing") the leadframe sheet 22.

Each of the dies 24, 26, 28 is electrically connected to an associated leadframe portion 25, 27, 29 of the leadframe sheet 22. In the assembly 10 of FIG. 2 the dies are electrically connected to the leadframe sheet 22 by bond wires 30. Each bond wire 30 has a first end 32 attached to an associated die, e.g., die 24, and a second end 34 attached to the leadframe portion, e.g., portion 25, on which the die is mounted.

After insertion of the leadframe sheet 22 and attached wire bonded dies 24, etc., the mold 10 is closed and the mold cavity 16 is filled with molten mold compound 40. The mold compound 40 flows under pressure into the cavity 16 through the runner 18, which is conventionally connected to a pressurized source of molten mold compound 40. After the mold compound 40 has filled the cavity, curing of the mold compound commences, initially while the mold 10 is closed, and subsequently after it is has been opened and the entire assembly of leadframe sheet 22, dies 24, etc. and mold compound 40 has been removed. After removal from the mold 10, the portion of the mold compound 40 that was in the runner 18 is removed from the portion of the mold compound covering the leadframe sheet 22. The portion of the mold compound that was in the runner is scrapped as waste. This waste is typically around 40% of the total amount of mold compound injected in a molding operation.

After the molded leadframe assembly has completed curing it is singulated along saw streets 36, 38, etc., indicated by dashed lines in FIG. 1, into separate IC package units.

Figure 2:
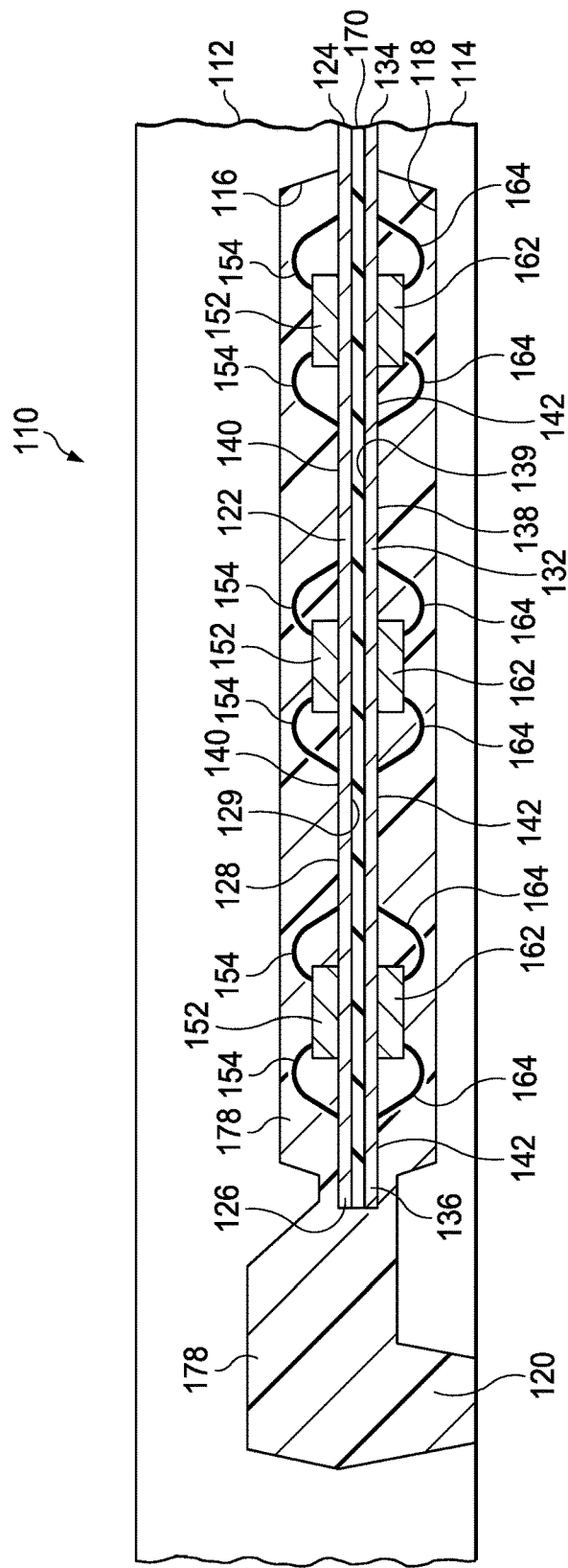
FIG. 2 is a cross-sectional elevation view of an example embodiment of a mold assembly that includes a mold with a double cavity configuration.

FIG. 2 is a cross-sectional elevation view of an example embodiment of a mold assembly 110 that includes a mold 111 with a double cavity configuration. The mold 111 includes upper and lower mold platens 112, 114 having upper and lower mold cavities 116, 118, respectively. A single mold runner 120 is in fluid communication with both mold cavities 116, 118.

The mold assembly 110 includes an upper substrate 122, which may be a leadframe sheet substrate. Hereafter "leadframe sheet substrate" is referred to by the shorter phrase "leadframe sheet." It is to be understood that substrates other than leadframe sheets may be used in the embodiments described in FIGS. 2, 3 and 5.

The substrate 122 has a first end 124 and a second end 126 and has a die attach side 128 and an opposite or "non-attach side" 129. A lower substrate 132, which in this embodiment may be a leadframe sheet, has a first end 134 and a second end 136 and also includes a die attach side 138 and an opposite or non-attach side 139. The upper substrate 122 and the lower substrate 132 each comprise a plurality of corresponding separate substrate portions 140 and 142, respectively, which are vertically aligned.

The mold assembly 110 also includes upper and lower substrate dies. The upper substrate dies 152 are mounted on the upper substrate portions 140 of the upper substrate 124 and are electrically connected thereto, as by upper bond wires 154. Similarly lower substrate dies 162 are attached to the separate substrate portions 142 of the lower substrate 134 and are connected thereto by lower leadframe bond wires 164. As illustrated in FIG. 2, a liner 170 may be used in some embodiments to separate the upper and lower substrates. In some embodiments when the respective substrates are, for example, nFBGA (New Fine Pitch Ball Grid Array packages) substrates or uBGA (Ultra FineLine Ball-Grid Array packages) substrates, rather than leadframe sheets, no liner is needed. The liner 170 engages the non-attach sides 129, 139 of the substrates 122, 132.

As further illustrated by FIG. 2, the mold assembly also includes heated mold compound 178 that is injected into the single mold runner and flows therethrough to fill both the upper and lower mold cavities 116, 118. The mold compound 178 is initially allowed to cure within the mold cavities 116, 118. Subsequently, the entire substrate/die/bond wire/mold compound assembly, including the mold compound 178 within the runner 120, is removed from the mold 111. The solidified mold compound 178 within the runner 120 is then removed and scrapped. Because there is a single runner 120 associated with both mold cavities 116, 118, the scrap produced by this new process is substantially reduced as compared to the scrap produced in the conventional process illustrated in FIG. 1.

Figure 3:
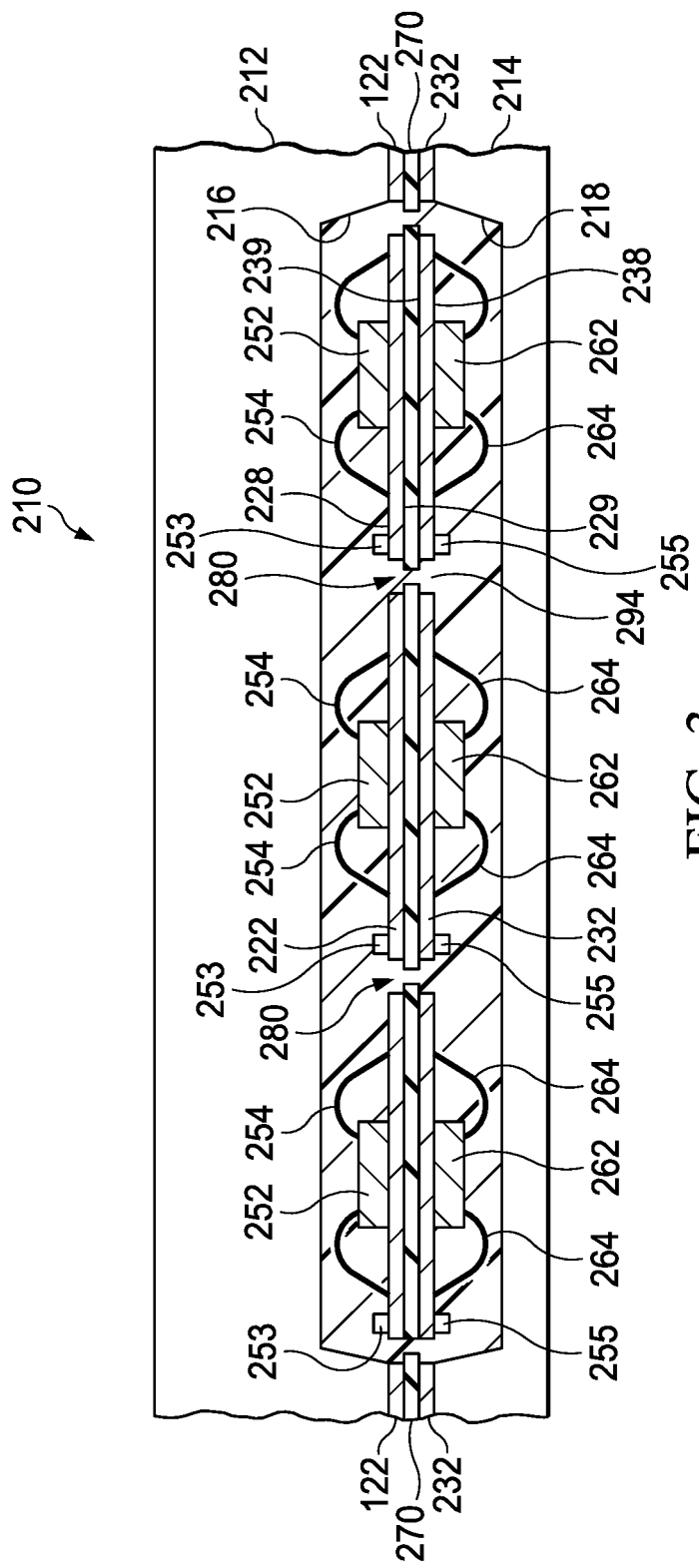
FIG. 3 is a cross-sectional elevation view of another example embodiment of a double cavity mold assembly.

FIG. 3 is a cross-sectional elevation view of another example embodiment of a double-sided mold assembly 210 including a mold 211 that has upper and lower mold platens 212, 214 having upper and lower mold cavities 216, 218, respectively. The mold 211 has a single runner 220. The assembly 210 illustrated in FIG. 3 is similar to that illustrated in FIG. 2, and similar structures therein are given the identical reference numerals as in FIG. 2, except that the reference numerals are 200 series rather than 100 series. The structures include: runner 220, upper substrate 222 having a first and second ends 224, 226 and die attach side 228 and non-attach side 229 and upper leadframe portions 240; a lower substrate 232 with a first and second ends 234, 236 and with a die attach side 238 and non-attach side 139 and separate upper and lower substrate portions 240 and 242; upper dies 252, which may be electrically connected to the upper substrate by bond wires 254; lower dies with bond wires 264; liner 270; and mold compound 278. One difference in the assembly of FIG. 3 is that upper and lower passive components 253, 255 (e.g., resistors, capacitors and/or inductors) are also operably mounted on each substrate portion 240 or 242 and electrically connected to the die(s) on the associated portion 240 or 242. Another difference in the assembly of FIG. 3 from that of FIG. 2 is that holes 280 have been bored through the two substrates 222, 232 and liner sheet 270 after initially sandwiching the liner sheet 270 between the two substrates 222, 232 and before insertion of this substrate/liner assembly into the mold 210. These holes 280 may be bored at each corner intersection of the substrates when they comprise leadframe sheets 222, 232. Four separate leadframe portions are integrally connected. (The illustrated embodiment shows the holes located at corner intersections of the sheets 222, 232, but the holes 280 may be provided at other locations. For example, if the binding feature is larger than corner space allows, several of the dies may be eliminated and the holes can be located on the leadframes, or other substrates, where the dies have been eliminated.)

Figure 4:
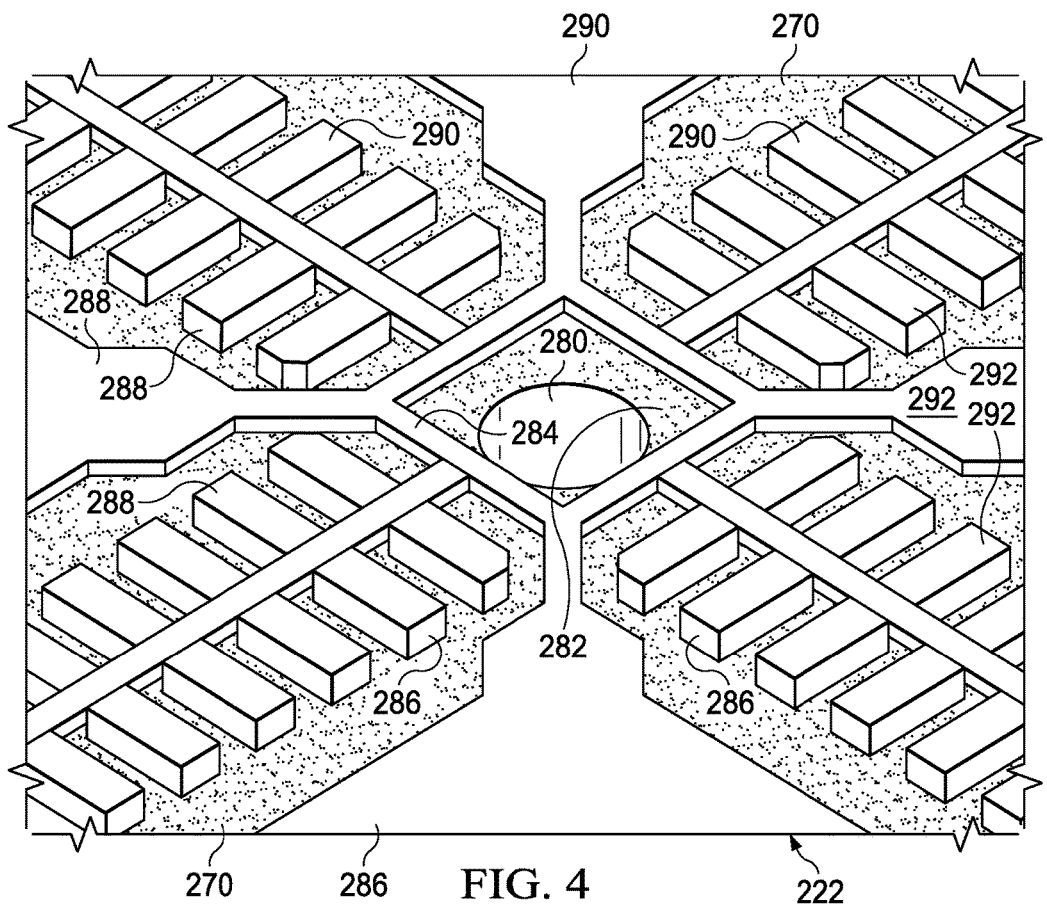
FIG. 4 is a detail isometric view of a portion of the double cavity mold assembly of FIG. 3.

FIG. 4 is a detail isometric view illustrating a portion of structure located around the holes 280 shown in FIG. 3. This structure includes a rectangular frame structure 284. The rectangular frame structure laterally connects first, second, third and fourth upper leadframe portions 286, 288, 290, 292, respectively, of the upper leadframe sheet 222. The lower leadframe sheet 232 has an identical configuration (not shown) lying directly below that of sheet 222. The hole 280 passes through the center of this rectangular frame portion 284 and an aligned portion 282 of the liner 270.

With reference to FIG. 3, the holes 280 through the assembled sheets 222, 270, 232 provide a path for molten mold compound 278. The mold compound 278 that flows through the holes 280 forms a connecting structure that holds the two sheets 222, 232 together and in alignment during curing, including the curing phase that takes place after removal of the molded leadframe/die/bond wire structure from the mold 211. The holes 280 may also help to provide pressure equalization between the upper and lower mold cavities 216 and 218 as molten mold compound flows into these cavities. The corner frame structure 284 and the mold compound 278 passing through the holes 280 are bored or cut out and removed after curing to allow the leadframe sheets 222, 232 to be separated and subsequently singulated. In another embodiment, the corner structure remains intact until singulation and the two connected molded leadframe sheets 222, 232 and liner 270 are all singulated simultaneously with deeper singulation cuts. The upper and lower IC package pairs, thus formed, are then separated. In this case, singulation removes the corner structure and connecting mold compound structure.

The prior art structure, as shown by FIG. 1, has a metal leadframe sheet 22 on one side of the assembly, and epoxy encapsulant compound 40 on the other side. Due to a mismatch in thermal expansion of these two materials, when the assembly is ejected from the mold 11 and cools down from a high mold temperature, the encapsulated leadframe sheet 22 tends to warp. Such warping makes the prior art leadframe sheet 22 difficult to work with and, in some cases, is so severe that the molded leadframe sheet 22 must be scrapped. In the assembly of FIG. 3, the connecting structure formed by the mold compound 278 after it solidifies in holes 280, combined with the symmetry of the two substrates, prevents warping of the substrates 222, 232.

Figure 5:
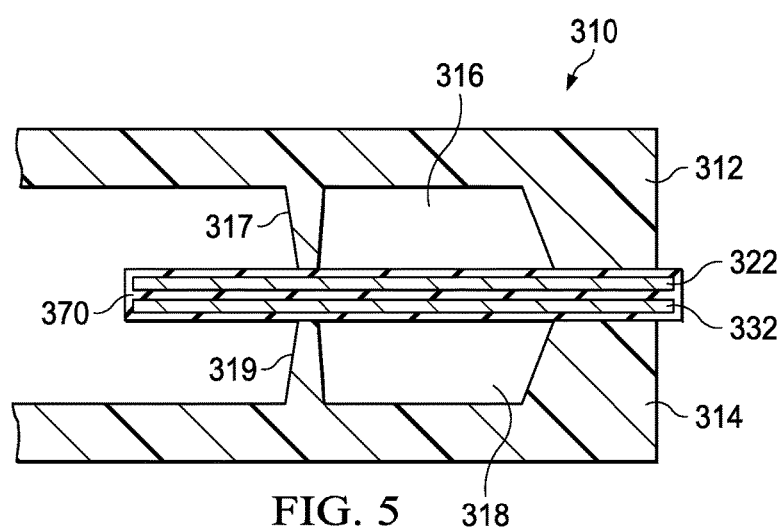
FIG. 5 is a cross-sectional elevation view of a portion of another example embodiment of a double cavity mold assembly.

FIG. 5 is a cross-sectional elevation view of a portion of another example embodiment of a double-sided mold assembly 310. The mold assembly 310 includes a mold 311 that comprises upper and lower mold platens 312, 314 having upper and lower mold cavities 316, 318, respectively. The mold 311 may be identical to the mold 211 illustrated in FIG. 3, except that upper projections 317 and lower projections 319 extends from the upper and lower mold platens, like symmetrical stalactites and stalagmites, to form a clamping assembly that sandwiches and holds upper and lower leadframes/substrates 322, 332 therebetween. These projections 317, 319 may be provided by ribs that are integrally formed with the respective upper and lower mold platens 312, 314 or may be provided by pins inserted through the walls of the mold platens or may be formed by other means. The projections may engage the leadframes/substrates 322, 332 at the boundaries of adjacent substrate portions, such that any irregularities in the mold compound layer formed by the projections 317, 319 is trimmed off during subsequent singulation.

This clamping assembly 317, 319 vertically supports the leadframes 322, 332, counteracting a tendency of the leadframes to droop under their own weight prior to the inflow of mold compound (not shown in FIG. 5).

As used herein terms such as up, down, above, under, vertical, horizontal, etc., are used in a relative sense to explain the physical relationship between various structures shown in the drawings, rather than in an absolute sense indicating an orientation of objects within a gravitational field.

Figure 6:
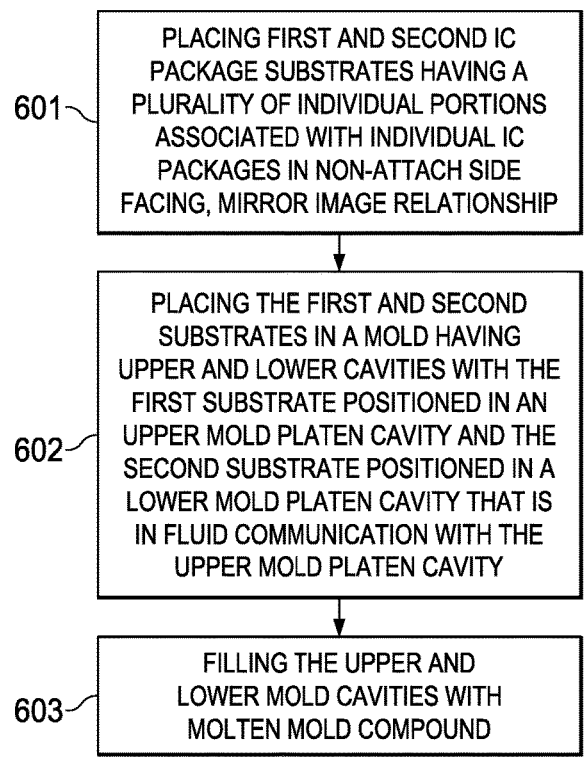
FIG. 6 is a flow chart that illustrates a method of making integrated circuit ("IC") packages.

FIG. 6 is a flow chart that illustrates a method of making integrated circuit ("IC") packages. The method includes, as shown at 601, placing first and second IC package substrates having a plurality of individual portions associated with individual IC packages in non-attach side facing, mirror image relationship. The method also includes, as shown at 602, placing the first and second substrates in a mold having upper and lower cavities with the first substrate positioned in an upper mold platen cavity and the second substrate positioned in a lower mold platen cavity that is in fluid communication with the upper mold platen cavity. As shown at 603, the method further includes filling the upper and lower mold cavities with molten mold compound.

Certain specific embodiments of double cavity mold assemblies and methods of use thereof have been expressly described in detail herein to aid those reading this disclosure to understand the inventive concepts involved. Alternative embodiments of such mold assemblies and methods will occur to those skilled in the art after reading this disclosure. It is intended that the language of the appended claims be broadly construed to cover such alternative embodiments, except as limited by the prior art.

What is claimed is:

1. A method of making integrated circuit ("IC") packages comprising:
    placing first and second substrates, each of the first and second substrates having a plurality of individual portions associated with individual IC packages in non-attach side facing, mirror image relationship;
    placing the first and second substrates in a mold having upper and lower cavities with the first substrate positioned in an upper mold platen cavity and the second substrate positioned in a lower mold platen cavity that is in fluid communication with the upper mold platen cavity; and positioning a liner between the first and second substrates; filling the upper and lower mold cavities with mold compound to create molded structures;
    wherein the liner is positioned between the first and second substrates such that a first hole and a second hole in the first substrate and the second substrate respectively, align with a hole in the liner; and a corner connecting structure connects portions of the first substrate and the second substrate, wherein an opening of the corner connecting structure aligns with the hole in the liner when the liner is positioned between the first and second substrates; flowing mold compound through the first hole, the second hole, and the hole in the liner to form connecting structures to hold the molded substrates together; curing the mold compound; and removing connecting structures holding the molded substrates together.

2. The method of claim 1 further comprising separating the molded substrates.

3. The method of claim 2 further comprising dicing the molded substrates.

4. The method of claim 1 further comprising dicing the molded substrates.

5. The method of claim 4 further comprising removing the connecting structure during the dicing.

6. The method of claim 1, wherein the plurality of individual portions associated with individual IC packages is placed in a non-attach side facing, mirror image relationship.

7. A method of making integrated circuit ("IC") packages comprising:
    positioning a first substrate in a first mold cavity and having a plurality of integrally connected substrate portions, each of the plurality of first substrate portions having a die attach side and a non-attach side, a first plurality of IC dies on the die attach sides of said plurality of first substrate portions;
    positioning a second substrate in the second mold cavity and having a plurality of integrally connected second substrate portions, each of the plurality of second substrate portion having a die attach side and a non-attach side, a second plurality of IC dies on the die attach sides of the plurality of second substrate portions;
    positioning a liner between said first and second substrates; and
    filling the first and second mold cavities with mold compound to create molded structures;
    wherein the first and second substrates are positioned with the non-attach sides of the first and second substrate portions thereof in facing relationship, the first and second substrates includes leadframes with corner connecting structures that connect said leadframes, the corner connecting structures having openings therein; wherein the first and second substrates have aligned holes extending therethrough; wherein the liner includes holes aligned with the holes in the first and second substrates.

8. The method of claim 7, wherein the first and second substrates comprise nFBGA (New Fine Pitch Ball Grid Array) substrates.

9. The method of claim 7, wherein the first and second substrates comprise flex-tape substrates.

10. The method of claim 7, wherein filling the first and second mold cavities with mold compound fills said aligned holes extending through said substrates.

11. The method of claim 7, wherein the corner connecting structures connect portions of the leadframes; and wherein openings of the corner connecting structure align with corresponding ones of the holes extending through the liner.

12. The method of claim 7 further comprising:
    curing the mold compound; and
    removing corner connecting structures.

13. The method of claim 12 further comprising separating the molded substrates.

14. The method of claim 13 further comprising dicing the molded substrates.

* * * * *